United States Patent
Hashizume et al.

(10) Patent No.: US 10,244,627 B2
(45) Date of Patent: Mar. 26, 2019

(54) SUBSTRATE FOR PRINTED WIRING BOARD AND METHOD FOR PRODUCING THE SAME, PRINTED WIRING BOARD AND METHOD FOR PRODUCING THE SAME, AND RESIN BASE MATERIAL

(71) Applicants: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

(72) Inventors: Kayo Hashizume, Osaka (JP); Yoshio Oka, Osaka (JP); Takashi Kasuga, Osaka (JP); Jinjoo Park, Koka (JP); Kousuke Miura, Koka (JP); Hiroshi Ueda, Koka (JP)

(73) Assignees: SUMITOMO ELECTRIC INDUSTRIES, LTD., Osaka-shi, Osaka (JP); SUMITOMO ELECTRIC PRINTED CIRCUITS, INC., Koka-shi, Shiga (JP)

( * ) Notice: Subject to any disclaimer, the term of this patent is extended or adjusted under 35 U.S.C. 154(b) by 0 days.

(21) Appl. No.: 15/536,809

(22) PCT Filed: Dec. 21, 2015

(86) PCT No.: PCT/JP2015/085664
§ 371 (c)(1),
(2) Date: Jun. 16, 2017

(87) PCT Pub. No.: WO2016/104420
PCT Pub. Date: Jun. 30, 2016

(65) Prior Publication Data
US 2017/0347464 A1    Nov. 30, 2017

(30) Foreign Application Priority Data
Dec. 25, 2014 (JP) .................... 2014-262647

(51) Int. Cl.
*H05K 1/09* (2006.01)
*H05K 3/12* (2006.01)
(Continued)

(52) U.S. Cl.
CPC ............ *H05K 1/092* (2013.01); *B32B 15/08* (2013.01); *B32B 15/088* (2013.01);
(Continued)

(58) Field of Classification Search
CPC .......... H05K 3/12; H05K 3/1283; H05K 1/09; H05K 1/092; H05K 1/095; H05K 1/097
See application file for complete search history.

(56) References Cited

U.S. PATENT DOCUMENTS

2009/0315849 A1* 12/2009 Ito ........................... C08J 7/045
                                                              345/173
2012/0031656 A1    2/2012 Oka et al.

FOREIGN PATENT DOCUMENTS

| CN | 102415222 A | 8/2006 |
| JP | H09-136378 A | 5/1997 |

(Continued)

*Primary Examiner* — Jeremy C Norris
(74) *Attorney, Agent, or Firm* — Drinker Biddle & Reath LLP

(57) ABSTRACT

An object is to provide a substrate for a printed wiring board that has good circuit formability while maintaining adhesion strength between a conductive layer (2) and a base film (1). The substrate includes a base film having an insulating property (1) and a conductive layer (2) formed on at least one surface of the base film (1). The maximum height Sz, which is defined in ISO25178, of the surface of the base film (1) is 0.05 μm or more and less than 0.9 μm.

16 Claims, 2 Drawing Sheets

(51) Int. Cl.
*B32B 15/08* (2006.01)
*B32B 15/088* (2006.01)
*H05K 1/03* (2006.01)
*H05K 3/38* (2006.01)
*H05K 1/02* (2006.01)
*H05K 1/05* (2006.01)
*H05K 3/24* (2006.01)
*H05K 3/18* (2006.01)

(52) U.S. Cl.
CPC ............ *H05K 1/0298* (2013.01); *H05K 1/03* (2013.01); *H05K 1/05* (2013.01); *H05K 1/09* (2013.01); *H05K 3/1283* (2013.01); *H05K 3/24* (2013.01); *H05K 3/38* (2013.01); *H05K 3/381* (2013.01); *H05K 3/182* (2013.01); *H05K 2201/0154* (2013.01); *H05K 2203/025* (2013.01); *H05K 2203/095* (2013.01)

(56) References Cited

FOREIGN PATENT DOCUMENTS

| JP | 2012-114152 A | 6/2012 |
| JP | 5470493 B1 | 4/2014 |
| JP | 2014-132213 A | 7/2014 |

* cited by examiner

SUBSTRATE FOR PRINTED WIRING BOARD AND METHOD FOR PRODUCING THE SAME, PRINTED WIRING BOARD AND METHOD FOR PRODUCING THE SAME, AND RESIN BASE MATERIAL

TECHNICAL FIELD

The present invention relates to a substrate for a printed wiring board, a printed wiring board, a resin base material, a method for producing a substrate for a printed wiring board, and a method for producing a printed wiring board.

BACKGROUND ART

In recent years, as electronic devices have been reduced in size and increased in performance, increase in the density of printed wiring boards has been required. Since higher density printed wiring boards have a smaller conductive pattern, the conductive pattern tends to peel off easily from a base film. Therefore, as a substrate for a printed wiring board that satisfies the requirements for high density, a substrate for a printed wiring board on which a fine conductive pattern can be formed and that has high adhesion between a conductive layer and a base film is in demand.

To meet such requirements, a substrate for a printed wiring board has been proposed in which thin copper layers are formed on a heat-resistant base film having an insulating property without interposing an adhesive layer therebetween (see Japanese Unexamined Patent Application Publication No. 9-136378). The existing substrate for a printed wiring board includes the thin copper layers, each having a thickness in the range of 0.25 to 0.30 µm, which are formed on both sides of the heat-resistant base film having an insulating property by using a sputtering method; and thick copper layers, which are formed on the thin copper layers by using an electroplating method.

CITATION LIST

Patent Literature

PTL 1: Japanese Unexamined Patent Application Publication No. 9-136378

SUMMARY OF INVENTION

Technical Problem

The existing substrate for a printed wiring board described above fulfills the requirements for high-density printed wiring, because adhesion strength between a conductive layer and the base film can be increased. However, in order to sufficiently increase adhesion strength between the conductive layer and the base film, it is generally preferable that the base film have a greater surface profile, while, on the other hand, circuit formability for forming a fine conductive pattern decreases as the profile increases. Accordingly, it cannot be said that the existing substrate for a printed wiring board has sufficiently high circuit formability, while adhesion strength between the conductive layer and the base film is improved.

An object of the present invention, which has been devised against the background described above, is to provide a substrate for a printed wiring board, a printed wiring board, a resin base material, a method for producing a substrate for a printed wiring board, and a method for producing a printed wiring board, each of which achieves good circuit formability while maintaining adhesion strength between a conductive layer and a base film.

Solution to Problem

The inventors carried out intensively studies to solve the problem described above and found that it is possible to improve circuit formability for forming a fine conductive pattern by reducing the maximum height $Sz$, which is defined in ISO25178, of the surface of the base film. Presumably, this is because, as the maximum height $Sz$ decreases, the maximum height difference between peaks and valleys decreases, and therefore it becomes easier to remove a conductive layer by etching and it becomes easier to form a fine conductive pattern. Thus, the inventors also found that, as a method of quantifying the roughness of the surface of a base film on which a conductive pattern is to be formed, parameters obtained by measuring a reference surface by using a non-contact laser profilometer (ISO25178) are more closely related to circuit formability than parameters obtained by measuring a cross-sectional curve by using an existing contact profilometer (JIS-B0601 (2013)). Although the reason for this is not clear, presumably, this is because a conductive pattern is formed so as to extend two-dimensionally along the plane of the base film.

A substrate for a printed wiring board according to an embodiment of the present invention, which has been devised based on these findings, includes a base film having an insulating property, and a conductive layer formed on at least one surface of the base film. A maximum height $Sz$, which is defined in ISO25178, of the surface of the base film is 0.05 µm or more and less than 0.9 win.

A printed wiring board according to another embodiment of the present invention, which has been devised to solve the problem described above, includes a conductive pattern. The conductive pattern is formed in the conductive layer of the substrate for a printed wiring board by using a subtractive method or a semi-additive method.

A resin base material according to another embodiment of the present invention, which has been devised to solve the problem described above, is a resin base material in which a maximum height $Sz$, which is defined in ISO25178, of a surface thereof is 0.05 µm or more and less than 0.9 µm.

A method for producing a substrate for a printed wiring board according to another embodiment of the present invention, which has been devised to solve the problem described above, includes a step of adjusting a maximum height $Sz$, which is defined in ISO25178, of a surface of a base film (maximum height $Sz$ adjusting step); a step of forming a conductive layer on one surface of the base film having an insulating property (conductive layer forming step); and a step of performing electroless plating to fill a surface of the conductive layer, the surface being opposite to the base film, with a metal derived from electroless plating (electroless plating step).

A method for producing a printed wiring board according to another embodiment of the present invention, which has been devised to solve the problem described above, includes a step of forming a conductive layer on at least one surface of the resin base material, and a step of forming a conductive pattern in the conductive layer by using a subtractive method or a semi-additive method.

Advantageous Effects of Invention

A substrate for a printed wiring board and a resin base material according to the present invention has good circuit formability while maintaining adhesion strength between a conductive layer and a base film. A printed wiring board according to the present invention can form a fine conductive pattern while maintaining adhesion strength between a conductive layer and a base film. By using a method for producing a printed wiring board according to the present invention, a printed wiring board having a fine conductive pattern can be produced while maintaining adhesion strength between a conductive layer and a base film.

REFERENCE SIGNS LIST

Figure 1:
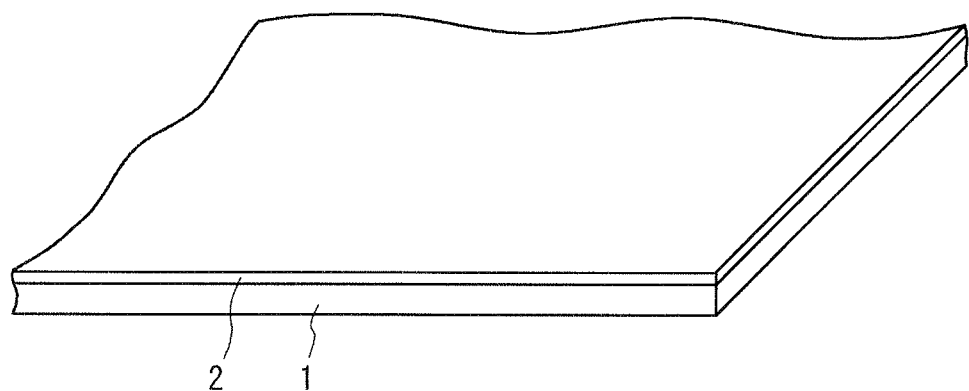
FIG. 1 is a schematic perspective view of a substrate for a printed wiring board according to an embodiment of the present invention.

1 base film
2 conductive layer
10 resist
11 conductive pattern

DESCRIPTION OF EMBODIMENTS

Description of Embodiments of Present Invention

A substrate for a printed wiring board according to an embodiment of the present invention includes a base film having an insulating property, and a conductive layer formed on at least one surface of the base film. The maximum height Sz, which is defined in ISO25178, of the surface of the base film is 0.05 µm or more and less than 0.9 µm.

A conductive layer having a fine pattern can be easily formed on the substrate for a printed wiring board, because the maximum height Sz of the surface of the base film is in the aforementioned range. Thus, circuit formability for forming a fine conductive pattern can be obtained. Moreover, when the maximum height Sz is in the aforementioned range, the orientations of metal crystals of the conductive layer, which is in contact with the base film, are nonuniform, so that chemical degradation of the base film occurs nonuniformly due to catalysis of the metal. Therefore, uniform chemical degradation of the base film, which reduces adhesion strength, is unlikely to occur. As a result, adhesion strength between the conductive layer and the base film can be maintained. Note that the maximum height Sz can be measured, for example, by using a laser microscope.

The arithmetical mean height Sa, which is defined in ISO25178, of the exposed surface of the base film is preferably 0.01 µm or more and less than 0.2 µm. When the arithmetical mean height Sa is in the aforementioned range, the conductive layer can be uniformly removed by etching more reliably. Therefore, circuit formability for forming a fine conductive pattern can be obtained more reliably, while maintaining adhesion strength between the conductive layer and the base film.

The contact angle between the exposed surface of the base film and pure water is preferably 4° or more and 60° or less. When the contact angle between the surface of the base film and pure water is in the aforementioned range, adhesion strength between the conductive layer and the base film can be improved. Here, the term "contact angle between . . . and pure water" refers to a contact angle measured by using a sessile drop method in accordance with JIS-R3257 (1999).

The main component of the base film is preferably polyimide. When the main component of the base film is polyimide, adhesion strength between the conductive layer and the base film is improved. Here, the term "main component" refers to a component having the highest content, which is, for example, a component having a content of 50 mass % or more.

The mass fraction of chrome in a region near the interface between the base film and the conductive layer is preferably 100 ppm or less. When the mass fraction of chrome in a region near the interface between the base film and the conductive layer is less than or equal to the above upper limit, the conductive layer can be more easily removed by etching when forming the conductive pattern, and the circuit formability can be further improved. Here, the term "region near the interface" refers to a region that is near the interface between the base film and the conductive layer, which is, for example, a region at a distance of 500 nm or less from the interface between the base film and the conductive layer.

The surface of the base film is preferably alkali treated or plasma treated. When the surface of the base film is alkali treated or plasma treated, adhesion strength between the conductive layer and the base film is improved.

The conductive layer is preferably formed by application and heating of a conductive ink including metal particles. When the conductive layer is formed by application and heating of a conductive ink including metal particles, a substrate for a printed wiring board having high adhesion strength between the conductive layer and the base film can be easily and reliably produced, without being limited by the material of the base film. The substrate for a printed wiring board can be produced at a low cost, because expensive vacuum equipment, which is necessary for physical vapor deposition such as sputtering in the method for producing a substrate for a printed wiring board described in Japanese Unexamined Patent Application Publication No. 9-136378, is not used.

The conductive layer is preferably made from a conductive ink including metal particles of copper or a copper alloy. When the metal is copper or a copper alloy, the conductive layer has high conductivity, and a printed wiring board having high conductivity can be produced at a low cost.

A printed wiring board according to another embodiment of the present invention is a printed wiring board including a conductive pattern. The conductive pattern is formed in the conductive layer of the substrate for a printed wiring board by using a subtractive method or a semi-additive method.

Since the substrate for a printed wiring board is used in the printed wiring board, a fine conductive pattern can be formed in the printed wiring board while maintaining adhesion strength between the conductive layer and the base film.

A resin base material according to another embodiment of the present invention is a resin base material, in which the maximum height Sz, which is defined in ISO25178, of a surface thereof is 0.05 μm or more and less than 0.9 μm.

Since the maximum height Sz of the surface of the resin base material is in the aforementioned range, when the resin base material is used for a base film of a substrate for a printed wiring board, a conductive layer having a fine pattern can be formed easily by etching. Thus, circuit formability for forming a fine conductive pattern can be obtained. Since the base film is not chemically degraded by making the maximum height Sz be in the aforementioned range, adhesion strength between the conductive layer and the base film can be maintained.

A method for producing a substrate for a printed wiring board according to another embodiment of the present invention is a method for producing the printed wiring board described above, including a step of adjusting the maximum height Sz, which is defined in ISO25178, of a surface of a base film (maximum height Sz adjusting step); a step of forming a conductive layer on one surface of the base film having an insulating property (conductive layer forming step); and a step of performing electroless plating to fill a surface of the conductive layer, the surface being opposite to the base film, with a metal derived from electroless plating (electroless plating step). By using the method for producing a substrate for a printed wiring board, it is possible to produce a substrate for a printed wiring board that maintains adhesion strength between the conductive layer and the base film.

A method for producing a substrate for a printed wiring board according to another embodiment of the present invention is the method for producing a substrate for a printed wiring board, in which the step of adjusting the maximum height Sz, which is defined in ISO25178, of a surface of a base film includes a step of alkali treating or plasma treating the base film. By alkali treating or plasma treating the surface of the base film, adhesion strength between the conductive layer and the base film is improved.

A method for producing a substrate for a printed wiring board according to another embodiment of the present invention is the method for producing a substrate for a printed wiring board, in which the step of forming a conductive layer on one surface of a base film having an insulating property includes a step of forming the conductive layer by application and heating of a conductive ink including metal particles of copper or a copper alloy. When the conductive layer is formed by application and heating of a conductive ink including metal particles as described above, a substrate for a printed wiring board having high adhesion strength between the conductive layer and the base film can be easily and reliably produced, without being limited by the material of the base film. Moreover, by using the method for producing a substrate for a printed wiring board according to the present invention, the substrate for a printed wiring board can be produced at a low cost, because expensive vacuum equipment, which is necessary for physical vapor deposition such as sputtering in the method for producing a substrate for a printed wiring board described in Japanese Unexamined Patent Application Publication No. 9-136378, is not used.

A method for producing a printed wiring board according to another embodiment of the present invention is the method for producing a printed wiring board, including a step of forming a conductive layer on one surface of a resin base material having an insulating property (conductive layer forming step), and a step of forming a conductive pattern (conductive pattern forming step). By using the method for producing a printed wiring board, a printed wiring board having a fine conductive pattern while maintaining adhesion strength between the conductive layer and the base film can be produced.

A method for producing a printed wiring board according to another embodiment of the present invention is the method for producing a printed wiring board, in which the step of forming a conductive layer on one surface of a resin base material having an insulating property includes a step of forming the conductive layer by application and heating of a conductive ink including metal particles of copper or a copper alloy. When the conductive layer is formed by application and heating of a conductive ink including metal particles, a substrate for a printed wiring board having high adhesion strength between the conductive layer and the base film can be easily and reliably produced, without being limited by the material of the base film. Moreover, by using the method for producing a printed wiring board according to the present invention, the printed circuit board can be produced at a low cost, because expensive vacuum equipment, which is necessary for physical vapor deposition such as sputtering in the method for producing a printed wiring board described in Japanese Unexamined Patent Application Publication No. 9-136378, is not used.

According to another embodiment of the present invention, in the method for producing a printed wiring board, the step of forming a conductive pattern includes a step of forming the conductive pattern in the conductive layer of a substrate for a printed wiring board by using a subtractive method or a semi-additive method.

Since the substrate for a printed wiring board is used in the printed wiring board, a fine conductive pattern can be formed in the printed wiring board while maintaining adhesion strength between the conductive layer and the base film.

According to another embodiment of the present invention, a method for producing a printed wiring board includes a step of forming a conductive layer on at least one surface of the resin base material, and a step of forming a conductive pattern in the conductive layer by using a subtractive method or a semi-additive method.

With the method for producing a printed wiring board, the conductive layer is formed on at least one surface of the resin base material. Therefore, a printed wiring board having a fine conductive pattern can be produced while maintaining adhesion strength between the conductive layer and the base film.

Details of Embodiments of Present Invention

Hereinafter, a substrate for a printed wiring board, a printed wiring board, a resin base material, and a method for producing a printed wiring board according to embodiments of the present invention will be described with reference to the drawings.

[Substrate for Printed Wiring Board]

The substrate for a printed wiring board shown in FIG. 1 includes a base film 1 having an insulating property and a conductive layer 2 formed on one surface of the base film 1. In the substrate for a printed wiring board, the maximum height Sz, which is defined in ISO25178, of the surface of the base film 1 is 0.05 μm or more and less than 0.9 μm.

<Base Film>

The base film 1 of the substrate for a printed wiring board has an insulating property. Examples of the material of the base film 1 include flexible resins such as polyimides, liquid-crystal polymers, fluororesins, polyethylene terephthalate, and polyethylene naphthalate; rigid materials such as paper impregnated with a phenolic resin, paper impregnated with an epoxy resin, glass composites, fiberglass cloths impregnated with an epoxy resin, Teflon (registered trademark), and glass base materials; and rigid-flexible materials that are composites of a hard material and a soft material. Among these, polyimides are preferred from the viewpoint of exhibiting high bonding strength to a metal included in the conductive layer 2.

The thickness of the base film 1, which is set in accordance with the specifications of a printed wiring board to be produced by using the substrate for a printed wiring board, is not particularly limited. For example, the lower limit of the average thickness of the base film 1 is preferably 5 µm, and more preferably 12 µm. The upper limit of the average thickness of the base film 1 is preferably 2 mm, and more preferably 1.6 mm. When the average thickness of the base film 1 is less than the lower limit, the base film 1 may have insufficient strength. On the other hand, when the average thickness of the base film 1 is more than the upper limit, it may be difficult to reduce the thickness of the printed wiring board.

The surface of the base film 1 to which conductive ink is to be applied is preferably roughened by performing surface treatment, such as wet-blasting treatment. By performing the surface treatment, adhesion strength between the conductive layer 2 and the base film 1 can be improved.

The surface of the base film 1 to which the conductive ink is to be applied is preferably subjected to hydrophilic treatment. Examples of the hydrophilic treatment include plasma treatment, which makes a surface hydrophilic by irradiation with plasma, and alkali treatment, which makes a surface hydrophilic with an alkali solution. By subjecting the base film 1 to hydrophilic treatment, the surface tension of the conductive ink on the base film 1 is reduced, and therefore the conductive ink can be uniformly applied to the base film 1 easily. By performing the hydrophilic treatment, the contact angle between the surface of the base film 1 and pure water is reduced, and therefore adhesion strength between the base film 1 and the conductive layer 2 is improved. Plasma treatment or alkali treatment may be performed after performing wet-blasting treatment. Among these treatments, alkali treatment is the most effective in improving adhesion strength.

Examples of alkali solution that can be used for the alkali treatment includes potassium hydroxide, sodium hydroxide, ammonia, calcium hydroxide, tetramethylammonium hydroxide, lithium hydroxide, monoethanolamine, and a mixture of such alkali and hydrogen peroxide.

Examples the plasma treatment include argon plasma treatment, which reforms a surface of an object in an argon atmosphere, and oxygen plasma treatment, which reforms a surface of an object in an oxygen atmosphere.

The wet-blasting treatment is performed by ejecting abrasive slurry including an abrasive, such as alumina or cerium oxide, against a surface of the base film 1, for example, at an air pressure that is 0.05 MPa or more and 0.5 MPa or less for a treatment time of 1 second or more and 1 minute or less.

The lower limit of the contact angle between the surface of the base film 1 and pure water is preferably 4°, and more preferably 10°. The upper limit of the contact angle is preferably 60°, and more preferably 50°. When the contact angle is less than the lower limit, it may become difficult to remove the conductive layer 2 by etching. On the other hand, when the contact angle is more than the upper limit, adhesion strength between the conductive layer 2 and the base film 1 may become insufficient. The contact angle can be adjusted by performing, for example, plasma treatment, alkali treatment, wet-blasting treatment, or the like on the surface of the base film 1 before applying a conductive ink to the surface.

The lower limit of the maximum height $Sz$ of the surface of the base film 1 is 0.05 µm, and more preferably 0.1 µm. The maximum height $Sz$ is less than 0.9 µm, more preferably less than 0.8 µm, and still more preferably less than 0.6 µm. When the maximum height $Sz$ is less than the lower limit, adhesion strength between the conductive layer 2 and the base film 1 may become insufficient. On the other hand, when the maximum height $Sz$ is more than or equal to the upper limit, it may become difficult to uniformly remove the conductive layer 2 by etching, and it may not be possible to form a fine conductive pattern. The maximum height $Sz$ can be adjusted by, for example, performing surface treatment, such as plasma treatment, alkali treatment, or wet-blasting treatment. For example, the maximum height $Sz$ may be adjusted to be in the aforementioned range when producing the base film 1. To be specific, for example, when a polyimide film is used as the base film 1, the maximum height $Sz$ can be adjusted by adjusting the stretching ratio when heating and stretching a gel film in the process of producing the polyimide film.

The lower limit of the arithmetical mean height $Sa$, which is defined in ISO25178, of the surface of the base film 1 is preferably 0.01 µm, and more preferably 0.04 µm. The arithmetical mean height $Sa$ is preferably less than 0.2 µm, and more preferably less than 0.1 µm. When the arithmetical mean height $Sa$ is less than the lower limit, adhesion strength between the conductive layer 2 and the base film 1 may become insufficient. On the other hand, when the arithmetical mean height $Sa$ is more than or equal to the upper limit, it may become difficult to uniformly remove the conductive layer 2 by etching, and it may not be possible to form a fine conductive pattern. The arithmetical mean height $Sa$ can be adjusted by, for example, performing surface treatment, such as plasma treatment, alkali treatment, or wet-blasting treatment. For example, the arithmetical mean height $Sa$ may be adjusted to be in the aforementioned range when producing the base film 1.

The lower limit of the root mean square height $Sq$, which is defined in ISO25178, of the surface of the base film 1 is preferably 0.01 µm, and more preferably 0.04 µm. The upper limit of the root mean square height $Sq$ is preferably 0.2 µm, and more preferably 0.1 µm. When the root mean square height $Sq$ is less than the lower limit, adhesion strength between the conductive layer 2 and the base film 1 may become insufficient. On the other hand, when the root mean square height $Sq$ is more than the upper limit, it may become difficult to uniformly remove the conductive layer 2 by etching, and it may not be possible to form a fine conductive pattern. The root mean square height $Sq$ can be adjusted by, for example, performing surface treatment, such as plasma treatment, alkali treatment, or wet-blasting treatment. For example, the root mean square height $Sq$ may be adjusted to be in the aforementioned range when producing the base film 1.

The lower limit of the skewness (the degree of asymmetry) $Ssk$, which is defined in ISO25178, of the surface of the base film 1 is preferably 0.05, and more preferably 0.2. The upper limit of the skewness $Ssk$ is preferably 0.45, and more preferably 0.4. When the skewness $Ssk$ is less than the lower limit, adhesion strength between the conductive layer 2 and the base film 1 may become insufficient. On the other hand, when the skewness Ssk is more than the upper limit, it may become difficult to uniformly remove the conductive layer 2 by etching, and it may not be possible to form a fine conductive pattern. The skewness Ssk can be adjusted by, for example, performing surface treatment, such as plasma treatment, alkali treatment, or wet-blasting treatment. For example, the skewness Ssk may be adjusted to be in the aforementioned range when producing the base film 1.

The lower limit of the kurtosis (the degree of sharpness) Sku, which is defined in ISO25178, of the surface of the base film 1 is preferably 1.5, and more preferably 2.5. The upper limit of the kurtosis Sku is preferably 3.5, and more preferably 3.1. When the kurtosis Sku is less than the lower limit, adhesion strength between the conductive layer 2 and the base film 1 may become insufficient. On the other hand, when the kurtosis Sku is more than the upper limit, it may become difficult to uniformly remove the conductive layer 2 by etching, and it may not be possible to form a fine conductive pattern. The kurtosis Sku can be adjusted by, for example, performing surface treatment, such as plasma treatment, alkali treatment, or wet-blasting treatment.

As an acid solution that is used to remove the conductive layer 2 of the substrate for a printed wiring board by etching, an acid etching solution that is generally used to remove a conductive layer can be used. Examples of the acid solution include a copper chloride solution, hydrochloric acid, sulfuric acid, and aqua regia.

The lower limit of the temperature of the etching solution during etching is preferably 10° C., and more preferably 20° C. The upper limit of the temperature of the etching solution is preferably 90° C., and more preferably 70° C. When the temperature of the etching solution is less than the lower limit, it may take a long time to perform etching, and the production efficiency of the substrate for a printed wiring board may decrease. On the other hand, when the temperature of the etching solution is more than the upper limit, the operating cost for adjusting the temperature may increase.

The lower limit of the etching time is preferably 1 minute, and more preferably 10 minutes. The upper limit of the etching time is preferably 60 minutes, and more preferably 30 minutes. When the etching time is shorter than the lower limit, the concentration of the etching solution may be high, and it may be difficult to handle the etching solution. On the other hand, when the etching time is longer than the upper limit, it may take an excessively long time to produce the substrate for a printed wiring board, and the production efficiency may decrease.

<Conductive Layer>

The conductive layer 2 is formed by application and heating of a conductive ink including metal particles and is formed on at least one surface of the base film 1. In the substrate for a printed wiring board, at least one surface of the base film 1 can be easily covered with a conductive coating, because the conductive layer 2 is formed by application of the conductive ink. In order to remove unnecessary organic substances in the conductive ink and to firmly fix the metal particles to one surface of the base film 1, the conductive layer 2 is preferably heated after application of the conductive ink.

(Conductive Ink)

The conductive ink, which forms the conductive layer 2, includes metal particles that provide conductivity to the conductive layer 2. As the conductive ink, an ink including metal particles, a dispersing agent that disperses the metal particles, and a dispersion medium is preferably used. By application of such a conductive ink, the conductive layer 2, which includes fine metal particles, is formed on at least one surface of the base film 1.

A metal included in the metal particles of the conductive ink is not particularly limited. For example, copper, nickel, aluminum, gold, silver, and an alloy of these can be used. Among these, copper or a copper alloy, which is a low-cost metal that has high conductivity and high adhesion with the base film 1, is preferably used. By using copper or a copper alloy as the metal particles, even if the conductive ink does not include chrome, sufficient adhesion strength between the conductive layer 2 and the base film 1 can be obtained.

The lower limit of the average particle size of the metal particles included in the conductive ink is preferably 1 nm, and more preferably 30 nm. The upper limit of the average particle size of the metal particles is preferably 500 nm, and more preferably 100 nm. When the average particle size of the metal particles is less than the lower limit, the dispersivity and the stability of the metal particles in the conductive ink may decrease. When the average particle size of the metal particles is more than the upper limit, the metal particles may easily settle, and it may be difficult for the metal particles to be distributed with a uniform density when the conductive ink is applied. Here, the term "average particle size" refers to the median diameter D50 of the particle size distribution in the dispersion liquid. The average particle size can be measured by using a particle size distribution analyzer (for example, Microtrac particle size analyzer "UPA-150EX" made by Nikkiso Co., Ltd.).

After the conductive layer 2 has been formed on at least one surface of the base film 1 by application and heating of a conductive ink, electroless plating is performed on a surface of the conductive layer 2 opposite to the base film 1. Due to the electroless plating, gaps in the metal included in the conductive layer 2, which has been formed on the base film 1 by application and heating of the conductive ink, are filled with a metal derived from electroless plating. When gaps remain in the conductive layer 2, the conductive layer 2 may be easily peeled off the base film 1 as a part of the conductive layer 2 having the gaps serves as a fracture origin. By filling the gaps with a metal derived from the electroless plating, peeling of the conductive layer 2 is prevented.

As a metal for the electroless plating, copper, nickel, silver, or the like, which has high conductivity, can be used. When copper or a copper alloy is used as metal particles included in the conductive ink, copper or nickel is preferably used for the electroless plating in consideration of adhesion with a copper layer formed from the conductive ink.

The lower limit of the average thickness of the conductive layer 2 after the electroless plating is preferably 0.25 μm, and more preferably 0.4 μm. The upper limit of the average thickness of the conductive layer 2 is preferably 3 μm, and more preferably 2 μm. When the average thickness of the conductive layer 2 is less than the lower limit, slits may be formed in the conductive layer 2, and the conductivity of the conductive layer 2 may decrease. On the other hand, when the average thickness of the conductive layer 2 is more than the upper limit, it may become difficult to reduce the thickness of the conductive layer 2.

The electroless plating may be omitted, provided that a required adhesion strength between the conductive layer 2 and the base film 1 can be obtained. In this case, electroplating (described below) may be performed instead of electroless plating. In the case where electroless plating is omitted, the lower limit of the average thickness of the conductive layer 2 is preferably 0.05 μm, and more preferably 0.2 μm. In the case where electroless plating is omitted, the upper limit of the average thickness of the conductive layer 2 is preferably 2 μm, and more preferably 1.5 μm. When electroless plating is omitted and the average thickness of the conductive layer 2 is less than the lower limit, slits may be formed in the conductive layer 2, and conductivity may decrease. On the other hand, when electroless plating is omitted and the average thickness of the conductive layer 2 is more than the upper limit, it may become difficult to reduce the thickness of the conductive layer 2.

It is also preferable to perform electroplating, after forming a thin layer by electroless plating as described above, to increase the thickness of the conductive layer 2. By performing electroplating after performing electroless plating, the thickness of the conductive layer can be adjusted accurately and easily, and it is possible to form a conductive layer having a thickness necessary for forming printed wiring in a comparatively short time. A metal having high conductivity, such as copper, nickel, silver, or the like, can be used for electroplating.

The thickness of the conductive layer 2 after being electroplated is not particularly limited and may be set in accordance with a printed circuit to be formed. For example, the lower limit of the average thickness of the conductive layer 2 after being electroplated is preferably 1 μm, and more preferably 2 μm. The upper limit of the average thickness of the conductive layer 2 after being electroplated is preferably 100 μm, and more preferably 50 μm. When the average thickness of the conductive layer 2 after being electroplated is less than the lower limit, the conductive layer may become easily damaged. On the other hand, when the average thickness of the conductive layer 2 after being electroplated is more than the upper limit, it may be difficult to reduce the thickness of the printed wiring board.

In some cases, the conductive ink may include chrome due to contamination from a stainless steel vessel and a stainless steel pipe, which are used when producing the conductive ink. In the case where the conductive ink includes chrome, chrome remains at least in the conductive layer 2. In the case where the conductive layer 2 includes chrome, the upper limit of the mass fraction of chrome in a region near the interface between the base film 1 and the conductive layer 2 is preferably 100 ppm, and more preferably 40 ppm. When the mass fraction of chrome is more than the upper limit, it may become difficult to remove the conductive layer 2 by etching, and it may not be possible to form a fine conductive pattern. The amount of chrome included in the conductive ink can be adjusted by changing the stainless steel vessel and the stainless steel pipe, which are used when producing the conductive ink, to those having a different chrome content. Thus, it is possible to adjust the mass fraction of chrome in a region near the interface between the base film 1 and the conductive layer 2.

[Method for Producing Substrate for Printed Wiring Board]

The method for producing a substrate for a printed wiring board includes a step of adjusting the maximum height Sz, which is defined in ISO25178, of a surface of a base film (maximum height Sz adjusting step); a step of forming a conductive layer on one surface of the base film having an insulating property by application and heating of a conductive ink including metal particles (conductive layer forming step); and a step of performing electroless plating to fill a surface of the conductive layer, the surface being opposite to the base film, with a metal derived from electroless plating (electroless plating step). In a substrate for a printed wiring board produced by using the method for producing a substrate for a printed wiring board, the maximum height Sz, which is defined in ISO25178, of the surface of the base film is 0.05 μm or more and less than 0.9 μm.

<Maximum Height Sz Adjusting Step>

In the maximum height Sz adjusting step, the maximum height Sz of the surface of the base film before forming a conductive layer is adjusted so that the maximum height Sz of the surface of the base film falls within the aforementioned range.

Examples of a method for adjusting the maximum height Sz of the surface of the base film before forming a conductive layer include a method of performing surface treatment on the base film 1 before application of a conductive ink. Examples of the surface treatment include plasma treatment, alkali treatment, and wet-blasting treatment. For example, plasma treatment or alkali treatment may be performed after performing wet-blasting treatment.

As another method for adjusting the maximum height Sz of the surface of the base film before forming a conductive layer, a method for adjusting the maximum height Sz when producing the base film 1 may be used. To be specific, for example, when a polyimide film is used as the base film 1, the maximum height Sz can be adjusted by adjusting the stretching ratio when heating and stretching a gel film in the process of producing the polyimide film.

<Conductive Layer Forming Step>

In the conductive layer forming step, a conductive ink including metal particles is applied to a surface of the base film 1, dried, and then heated.

(Method for Producing Metal Particles)

Here, a method for producing metal particles, which are to be dispersed in the conductive ink, will be described. The metal particles can be produced by using a high-temperature treatment method, a liquid-phase reduction method, a gas-phase method, or the like.

The metal particles can be produced by using a liquid-phase reduction method, for example, as follows: a dispersing agent and a water-soluble metal compound, which serves as the source of metal ions to form metal particles, are dissolved in water; and a reducing agent is added to cause a reduction reaction of the metal ions for a certain time. The liquid-phase reduction method can provide metal particles having a uniform spherical or granular shape and having a very small size. Examples of the water-soluble metal compound serving as the source of metal ions include, in the case of copper, copper(II) nitrate ($Cu(NO_3)_2$) and copper(II) sulfate pentahydrate ($CuSO_4.5H_2O$); and, in the case of silver, silver(I) nitrate ($AgNO_3$) and silver methanesulfonate ($CH_3SO_3Ag$); in the case of gold, tetrachloroauric(III) acid tetrahydrate ($HAuCl_4.4H_2O$); and, in the case of nickel, nickel(II) chloride hexahydrate ($NiCl_2.6H_2O$) and nickel(II) nitrate hexahydrate ($Ni(NO_3)_2.6H_2O$). Also for other metal particles, water-soluble compounds such as chlorides, nitrate compounds, and sulfate compounds can be used.

When producing the metal particles by using the liquid-phase reduction method, various reducing agents that can reduce and precipitate metal ions in a reaction system in a liquid phase (aqueous solution) can be used. Examples of the reducing agents include sodium borohydride, sodium hypophosphite, hydrazine, transition metal ions such as trivalent titanium ions and divalent cobalt ions, ascorbic acid, reducing sugars such as glucose and fructose, and polyhydric alcohols such as ethylene glycol and glycerin. Among these, trivalent titanium ions are used in a titanium redox process, in which metal ions are reduced by a redox action during oxidation of trivalent titanium ions into tetravalent ions to precipitate metal particles. Metal particles obtained by the titanium redox process have a small and uniform particle size. In addition, the titanium redox process can provide metal particles having a spherical or granular shape. Therefore, by using the titanium redox method, the conductive layer 2 is more densely filled with the metal particles and can be formed as layer having a higher density.

The particle size of metal particles can be adjusted by adjusting the types and mixing ratio of the metal compound, the dispersing agent, and the reducing agent, and by adjusting, for example, the stirring rate, the temperature, the time, and the pH during the reduction reaction of the metal compound. For example, the pH of the reaction system is preferably adjusted to a value that is 7 or more and 13 or less in order to obtain metal particles having a very small particle size as in the present embodiment. At this time, a pH adjuster may be used to adjust the pH of the reaction system to be in the aforementioned range. As the pH adjuster, a common acid or alkali, such as hydrochloric acid, sulfuric acid, sodium hydroxide, or sodium carbonate, is used. In particular, in order to prevent deterioration of surrounding components, the pH adjuster is preferably nitric acid or ammonia, which is free from impurity elements. Examples of impurity elements include alkali metals, alkaline-earth metals, and halogen elements such as chlorine, sulfur, phosphorus, and boron.

(Preparation of Conductive Ink)

Next, a method of preparing the conductive ink will be described. As a dispersing agent included in the conductive ink, various dispersing agents that have a molecular weight of 2,000 or more and 300,000 or less and that can sufficiently disperse metal particles that have precipitated in the dispersion medium can be used. By using a dispersing agent having a molecular weight in the aforementioned range, it is possible to sufficiently disperse the metal particles in the dispersion medium and to form the conductive layer 2 so as to have a film quality that is dense and defect-free. When the molecular weight of the dispersing agent is less than the lower limit, it may not be possible to sufficiently obtain the effect of preventing aggregation and maintaining dispersion of the metal particles. As a result, it may not be possible to form the conductive layer 2 on the base film 1 so as to be dense and to have only a small number of defects. On the other hand, when the molecular weight of the dispersing agent is more than the upper limit, the dispersing agent may be excessively bulky, and sintering between metal particles may be inhibited when heating the conductive ink after application of the conductive ink, which may result in generation of voids. In addition, the quality of the conductive layer 2 may be degraded in terms of denseness, or the decomposition residue of the dispersing agent may cause a decrease in the conductivity.

The dispersing agent is preferably free from sulfur, phosphorus, boron, halogen, and alkali from the viewpoint of preventing deterioration of components. As long as the molecular weight is in the aforementioned range, preferred examples of the dispersing agent include amine-based polymeric dispersing agents such as polyethyleneimine and polyvinylpyrrolidone; hydrocarbon-based polymeric dispersing agents having carboxyl groups in the molecule thereof, such as polyacrylic acid and carboxymethyl cellulose; and polymeric dispersing agents having polar groups such as poval (polyvinyl alcohol), styrene-maleic acid copolymers, olefin-maleic acid copolymers, and copolymers having a polyethyleneimine moiety and a polyethylene oxide moiety in a single molecule.

The dispersing agent may be added to the reaction system in the form of a solution in which the dispersing agent is dissolved in water or a water-soluble organic solvent. The content of the dispersing agent is preferably 1 part by mass or more and 60 parts by mass or less relative to 100 parts by mass of the metal particles. The dispersing agent prevents aggregation of the metal particles by surrounding the metal particles, and thereby appropriately disperses the metal particles. When the content of the dispersing agent is less than the lower limit, the effect of preventing aggregation may become insufficient. On the other hand, when the content of the dispersing agent is more than the upper limit, when heating the conductive ink after application of the conductive ink, the excessive dispersing agent may inhibit firing, including sintering, of the metal particles, which may result in generation of voids, or the decomposition residue of the polymeric dispersing agent may remain as impurities in the conductive layer 2, which may result in a decrease in the conductivity.

The content of water serving as a dispersion medium in the conductive ink is preferably 20 parts by mass or more and 1,900 parts by mass or less relative to 100 parts by mass of the metal particles. The water in the dispersion medium sufficiently swells the dispersing agent to satisfactorily disperse the metal particles surrounded by the dispersion agent. When the content of water is less than the lower limit, this effect of swelling the dispersing agent, which is exerted by water, may become insufficient. On the other hand, when the content of water is more than the upper limit, the content of the metal particles in the conductive ink may be low, and it may not be possible to form a good conductive layer 2, having required thickness and density, on a surface of the base film 1.

The organic solvent, which may be optionally added to the conductive ink, may be selected from various water-soluble organic solvents. Specific examples the organic solvent include alcohols such as methyl alcohol, ethyl alcohol, n-propyl alcohol, isopropyl alcohol, n-butyl alcohol, isobutyl alcohol, sec-butyl alcohol, and tert-butyl alcohol; ketones such as acetone and methyl ethyl ketone; esters of, for example, a polyhydric alcohol such as ethylene glycol or glycerin; and glycol ethers such as ethylene glycol monoethyl ether and diethylene glycol monobutyl ether.

The content of the water-soluble organic solvent is preferably 30 parts by mass or more and 900 parts by mass or less relative to 100 parts by mass of the metal particles. When the content of the water-soluble organic solvent is less than the lower limit, it may not be possible to sufficiently obtain the effects, which are exerted by the organic solvent, of adjusting the viscosity of the dispersion liquid and adjusting the vapor pressure. On the other hand, when the content of the water-soluble organic solvent is more than the upper limit, the effect of swelling the dispersing agent, which is exerted by water, may become insufficient, which may result in occurrence of aggregation of the metal particles in the conductive ink.

When producing the metal particles by using the liquid-phase reduction method, metal particles precipitated in a liquid-phase (aqueous solution) reaction system are subjected to steps of, for example, filtration, washing, drying, and pulverization, and the resulting powder may be used for preparing the conductive ink. In this case, the powdery metal particles, water serving as a dispersion medium, a dispersing agent, and an optional water-soluble organic solvent may be mixed with a predetermined ratio to prepare a conductive ink containing the metal particles. In this case, the liquid phase (aqueous solution) in which the metal particles are precipitated is preferably used as a starting material to prepare the conductive ink. To be specific, the liquid phase (aqueous solution) containing the precipitated metal particles is subjected to processes, such as ultrafiltration, centrifugation, washing with water, and electrodialysis, to remove impurities and is optionally concentrated to remove water. Conversely, after adding water to adjust the concentration of the metal particles, a water-soluble organic solvent may be optionally mixed with a predetermined ratio to prepare a conductive ink containing the metal particles. By using this method, it is possible to prevent generation of coarse and irregular particles due to aggregation of the metal particles during drying. Thus, a dense and uniform conductive layer 2 can be easily formed.

(Application of Conductive Ink)

Existing application methods can be used to apply a conductive ink, in which metal particles are dispersed, to one surface of the base film 1. Examples of the methods include spin coating, spray coating, bar coating, die coating, slit coating, roll coating, and dip coating. Alternatively, the conductive ink may be applied to only a portion of one surface of the base film 1, for example, by screen printing or by using a dispenser.

(Heating Treatment)

The conductive ink is applied to one surface of the base film 1, dried, and heated. By heating the conductive ink after applying the conductive ink to one surface of the base film 1, the applied layer is sintered, and the conductive layer 2, which is a sintered applied layer, is formed so as to be firmly fixed to the one surface of the base film 1. By heating the conductive ink, the dispersing agent and other organic compounds included in the conductive ink are vaporized, decomposed, and removed from the applied layer. Thus, the metal particles, which remain in the applied layer, are in a sintered state or a pre-sintered state in which the metal particles are in close contact with each other and solidly joined to each other.

The conductive ink is heated in an atmosphere that contains a certain amount of oxygen. The lower limit of the oxygen concentration of the atmosphere when heating the conductive ink is preferably 1 ppm by volume, and more preferably 10 ppm by volume. The upper limit of the oxygen concentration of the atmosphere is preferably 10,000 ppm by volume, and more preferably 1,000 ppm by volume. When the oxygen concentration is less than the lower limit, the cost for preparing the atmosphere for heating may increase. On the other hand, when the oxygen concentration is more than the upper limit, the metal particles may become excessively oxidized, and the conductivity of the conductive layer 2 may decrease.

The lower limit of the heating temperature is preferably 150° C., and more preferably 200° C. The upper limit of the heating temperature is preferably 500° C., and more preferably 400° C. When the heating temperature is less than the lower limit, the metal particles, which form the conductive layer 2, may not become sufficiently close to each other, and it may not be possible to obtain sufficient adhesion strength between the conductive layer 2 and the base film 1. On the other hand, when the heating temperature is more than the upper limit, the base film 1 may deform if the base film 1 is made of an organic resin, such as polyimide.

The lower limit of the heating time is preferably 30 minutes, and more preferably 1 hour. The upper limit of the heating time is preferably 10 hours, and more preferably 5 hours. When the heating time is less than the lower limit, the metal particles may not be sintered, and it may not be possible to obtain sufficient adhesion strength between the conductive layer 2 and the base film 1. On the other hand, when the heating time is more than the upper limit, it may take an excessively long time to produce the substrate for a printed wiring board, and the production efficiency may decrease.

<Electroless Plating Step>

In the electroless plating step, electroless plating is performed on a surface of the conductive layer 2 formed on the base film 1 in the conductive layer forming step, the surface being opposite to the base film 1.

The electroless plating is performed together with processes such as a cleaner step, a water-washing step, an acid-treatment step, a water-washing step, a pre-dip step, an activator step, a water-washing step, a reduction step, a water-washing step, a metal-layer forming step, a water-washing step, and a drying step. Among these steps, an activator step is not necessary and may be omitted when performing electroless plating.

When the conductive layer is required to have an average thickness of, for example, 1 µm or more, after performing electroless plating, electroplating is further performed until a conductive layer having a required thickness is formed. The electroplating can be performed so as to rapidly form a conductive layer having a predetermined thickness and having no defects by using a conventionally known electroplating bath that is suitable for a metal to be plated, such as copper, nickel, or silver, and by selecting appropriate conditions.

[Printed Wiring Board]

The printed wiring board is produced by forming a conductive pattern in the substrate for a printed wiring board shown in FIG. 1. The conductive pattern is formed in the conductive layer 2 of the substrate for a printed wiring board by using a subtractive method or a semi-additive method.

[Resin Base Material]

The resin base material is a base material that is used as the base film 1 of the substrate for a printed wiring board and that has an insulating property.

Examples of the main component of the resin base material include flexible resins such as polyimides, liquid-crystal polymers, fluororesins, polyethylene terephthalate, and polyethylene naphthalate. Among these, polyimides are preferred from the viewpoint of exhibiting high bonding strength to a metal included in the conductive layer 2.

The lower limit of the maximum height Sz, which is defined in ISO25178, of the surface of the resin base material is 0.05 pin, and more preferably 0.1 The maximum height Sz is less than 0.9 µm, more preferably less than 0.8 µm, and still more preferably less than 0.5 µm. When the maximum height Sz is less than the lower limit and the resin base material is used for the base film 1 of the substrate for a printed wiring board, adhesion strength between the base film 1 and the conductive layer 2 may become insufficient. On the other hand, when the maximum height Sz is more than or equal to the upper limit and the resin base material is used for the base film 1 of the substrate for a printed wiring board, it may become difficult to uniformly remove the conductive layer 2 by etching, and it may not be possible to form a fine conductive pattern. The maximum height Sz can be adjusted by using the method described above.

The lower limit of the contact angle between the surface of the resin base material and pure water is preferably 4°, and more preferably, 8°. The upper limit of the contact angle is preferably 30°, and more preferably 20°. When the contact angle is less than the lower limit and the resin base material is used for the base film 1 of the substrate for a printed wiring board, it may become difficult to remove the conductive layer 2 by etching. On the other hand, when the contact angle is more than the upper limit and the resin base material is used for the base film 1 of the substrate for a printed wiring board, it may not be possible to obtain sufficient adhesion strength between the conductive layer 2 and the base film 1.

[Method for Producing Printed Wiring Board]

The method for producing a printed wiring board includes a step of forming a conductive layer on at least one surface of the resin base material (conductive layer forming step), and a step of forming a conductive pattern in the conductive layer by using a subtractive method or a semi-additive method (conductive pattern forming step). In the conductive layer forming step of the method for producing a printed wiring board, a conductive layer is formed by using the resin base material as a base film, as in the conductive layer forming step of the aforementioned method for producing a substrate for a printed wiring board. Here, a conductive pattern forming step that uses a subtractive method will be described.

<Conductive Pattern Forming Step>

Figure 2A:
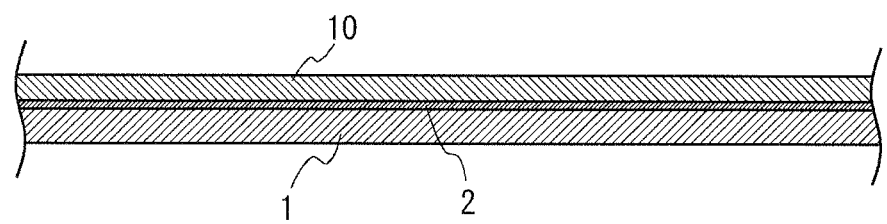
FIG. 2A is a partial schematic sectional view illustrating a method for producing a printed wiring board using the substrate for a printed wiring board shown in FIG. 1.
Figure 2B:
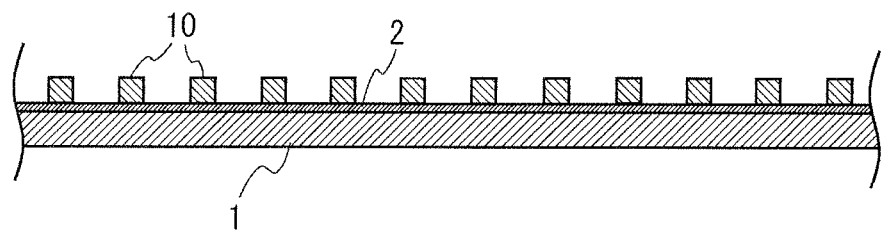
FIG. 2B is a partial schematic sectional view illustrating a step, which is performed subsequent to the step shown in FIG. 2A, of the method for producing a printed wiring board using the substrate for a printed wiring board shown in FIG. 1.
Figure 2C:
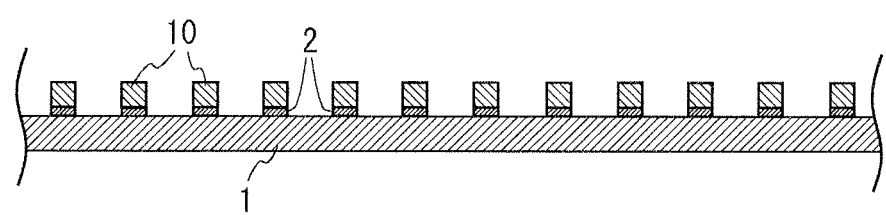
FIG. 2C is a partial schematic sectional view illustrating a step, which is performed subsequent to the step shown in FIG. 2B, of the method for producing a printed wiring board using the substrate for a printed wiring board shown in FIG. 1.
Figure 2D:
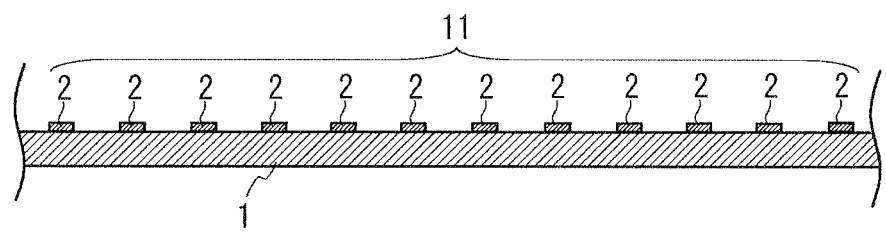
FIG. 2D is a partial schematic sectional view illustrating a step, which is performed subsequent to the step shown in FIG. 2C, of the method for producing a printed wiring board using the substrate for a printed wiring board shown in FIG. 1.

First, as illustrated in FIG. 2A, in the conductive layer forming step, a conductive layer 2 is formed on one surface of the resin base material, and a photosensitive resist 10 is formed so as to cover the conductive layer 2. Next, as illustrated in FIG. 2B, the resist 10 is patterned so as to correspond to a conductive pattern by, for example, exposure and development. Next, as illustrated in FIG. 2C, etching is performed so as to remove parts of the conductive layer 2 other than the conductive pattern by using the resist 10 as a mask. Finally, as illustrated in FIG. 2D, by removing the remaining parts of the resist 10, a printed wiring board having a conductive pattern 11 formed on the base film 1 is obtained.

The conductive pattern forming step described here forms a circuit by using a subtractive method. Alternatively, the printed wiring board can be produced by forming a conductive pattern by using another known method, such as a semi-additive method. Since the printed wiring board is produced by using the substrate for a printed wiring board, the maximum height Sz of the surface of the base film 1 is 0.05 µm or more and less than 0.9 µm. Therefore, the printed wiring board has sufficient adhesion strength between the conductive layer 2 and the base film 1 and has good circuit formability for forming a fine conductive pattern.

[Advantages]

In the substrate for a printed wiring board, the maximum height Sz of the surface of the base film is 0.05 µm or more and less than 0.9 µm. Thus, the substrate for a printed wiring board can provide circuit formability for forming a fine conductive pattern while maintaining adhesion strength between the conductive layer and the base film.

Other Embodiments

It is to be understood that the embodiments disclosed herein are examples and are not restrictive in all respects. The scope of the present invention is not limited to the configurations of the embodiments described above and is defined by the claims. The scope of the present invention is intended to cover all the modifications within the meanings of the claims and the equivalents thereof.

In the embodiments described above, the conductive layer 2 is formed on one surface of the base film 1. Alternatively, a double-sided printed wiring board may be formed by forming conductive layers on both sides of a base film by using a similar method. A conductive layer may be formed by using a different method on the other surface of the substrate for a printed wiring board obtained in the embodiments described above. For example, a conductive layer may be formed on the other surface of the substrate for a printed wiring board by electroplating.

In the method for producing a substrate for a printed wiring board according to the embodiment described above, a conductive layer is formed on one surface of a base film by application and heating of a conductive ink. Alternatively, as long as the maximum height Sz of the surface of the base film can fall within the aforementioned range, a substrate for a printed wiring board may be produced by using a different method.

EXAMPLES

Hereinafter, the present invention will be described further in detail by using Examples. However, the present invention is not limited to the Examples.

Examples

As Examples, six substrates No. 1 to No. 6 for a printed wiring board shown in Table 1 were produced by changing the conditions for performing surface treatment of the base film before application of the conductive ink.

The substrate No. 1 for a printed wiring board shown in Table 1 was produced as follows. First, a conductive ink having a copper concentration of 26 mass % was made by dispersing copper particles having an average particle size of 80 nm in water as a solvent. Next, a polyimide film (Apical "NPI", made by Kaneka Corporation) having an average thickness of 25 µm was used as a base film having an insulating property; and a copper layer was formed by applying the conductive ink to one surface of the polyimide film and by drying the conductive ink in air. Then, it was heat treated in a nitrogen atmosphere for 2 hours at 350° C. Next, electroless copper plating, using palladium as a catalyst, was performed on one surface of the copper layer formed on the polyimide film so as to increase the average thickness of the copper layer to 1 µm. Further, copper electroplating was performed to obtain a substrate for a printed wiring board including a conductive layer made of copper and having a total average thickness of 20 µm.

The substrate No. 2 for a printed wiring board was obtained in the same way as the substrate No. 1 for a printed wiring board except that atmospheric pressure plasma treatment was performed on a polyimide film before application of the conductive ink.

The substrate No. 3 for a printed wiring board was obtained in the same way as the substrate No. 1 for a printed wiring board except that alkali treatment was performed on a polyimide film before application of the conductive ink by immersing the polyimide film in a sodium hydroxide aqueous solution having a concentration of 2.5 mol/L at 40° C. for 90 seconds.

The substrate No. 4 for a printed wiring board was obtained in the same way as the substrate No. 1 for a printed wiring board except that wet-blasting treatment was performed on a polyimide film before application of the conductive ink by ejecting abrasive slurry including alumina abrasive with a pressure of 0.2 Pa for 30 seconds.

The substrate No. 5 for a printed wiring board was obtained in the same way as the substrate No. 2 for a printed wiring board except that, before performing the atmospheric pressure plasma treatment, wet-blasting treatment was performed in the same way as in No. 4 on a polyimide film before application of the conductive ink.

The substrate No. 6 for a printed wiring board was obtained in the same way as the substrate No. 3 for a printed wiring board except that, before performing the alkali treatment, wet-blasting treatment was performed in the same way as in No. 4 on a polyimide film before application of the conductive ink.

Comparative Example

As a comparative example, a substrate No. 7 for a printed wiring board, which was a copper-clad laminate in which a copper foil having an average thickness of 20 μm was affixed to a polyimide film having an average thickness of 25 μm, was prepared.
<Evaluation of Adhesion Strength>
For each of the substrates No. 1 to No. 7 for a printed wiring board, the peel strength (N/cm) between the polyimide film and the conductive layer was measured by performing a 180 degree peel test, and adhesion strength between the polyimide film and the conductive layer was evaluated. The peel strength was measured in accordance with JIS-K6854-2 (1999). Table 1 shows the results of measuring the peel strength.
<Measurement of Maximum Height>
For each of the substrates No. 1 to No. 7 for a printed wiring board, the copper layer was removed by using a copper chloride etching solution having a copper concentration of 4 mol/L and a hydrochloric acid concentration of 3 mol/L. Then, the maximum height Sz, the arithmetical mean height Sa, the root mean square height Sq, the skewness Ssk, and the kurtosis Sku of the surface of the polyimide film were measured in accordance with ISO25178 by suing a laser microscope (3-D laser scanning microscope "VK-X150", made by KEYENCE Corporation). Table 1 shows the measurement results.
<Measurement of Contact Angle>
For each of the substrates No. 1 to No. 7 for a printed wiring board, after removing the copper layer by using the copper chloride etching solution, the contact angle between the surface of the polyimide film and pure water was measured. To be specific, a drop of pure water was placed on the surface of the polyimide by using a microsyringe; and, 30 seconds after placing the drop, the contact angle of the drop was measured in accordance with a sessile drop method as defined in JIS-R3257 (1999) by using a contact angle meter ("FACE CA-D", made by Kyowa Interface Science Co., Ltd.). Table 1 shows the results of measuring the contact angle.

<Evaluation of Circuit Formability>
For each of the substrates No. 1 to No. 7 for a printed wiring board, fine conductive patterns, having L(line)/S (space)=10 μm/10 μm, 15 μm/15 μm, 20 μm/20 μm, 25 μm/25 μm, 30 μm/30 μm, and 35 μm/35 μm, were formed by removing part of the copper layer by using the copper chloride etching solution. At this time, the fine conductive patterns formed on the polyimide film were observed by using a scanning electron microscope (SEM). Among the patterns in which peeling of the conductive pattern did not occur, a short circuit between conductive patterns did not occur, and defects were not found, one of the patterns having the smallest L/S was determined as a fine circuit pattern that can be formed in the substrate for a printed wiring board. Table 1 shows the fine circuit patterns that can be formed in the substrates for a printed wiring board, which were determined in this way.

TABLE 1

| No. | Conductive layer forming method | Pretreatment | Peel strength (N/cm) | Maximum height Sz (μm) | Arithmetical mean height Sa (μm) | Root means square height Sq (μm) | Skewness Ssk | Kurtosis Sku | Contact angle (°) | Circuit formability L/S (μm) |
|---|---|---|---|---|---|---|---|---|---|---|
| 1 | Conductive ink application | No treatment | 5.1 | 0.205 | 0.044 | 0.051 | 0.070 | 1.867 | 78 | 20/20 |
| 2 | Conductive ink application | Plasma | 4.8 | 0.185 | 0.017 | 0.022 | 0.052 | 3.450 | 44 | 15/15 |
| 3 | Conductive ink application | Alkali | 10.4 | 0.260 | 0.030 | 0.037 | 0.144 | 3.129 | 40 | 10/10 |
| 4 | Conductive ink application | Wet-blasting | 7.4 | 0.495 | 0.047 | 0.060 | 0.325 | 2.968 | 38 | 15/15 |
| 5 | Conductive ink application | Wet-blasting + Plasma | 8.3 | 0.539 | 0.058 | 0.072 | 0.352 | 3.065 | 34 | 15/15 |
| 6 | Conductive ink application | Wet-blasting + Alkali | 9.2 | 0.337 | 0.040 | 0.049 | 0.278 | 2.845 | 32 | 15/15 |
| 7 | Copper-clad laminate | No treatment | 9.5 | 5.775 | 0.492 | 0.632 | 0.074 | 3.467 | 118 | 35/35 |

[Evaluation Results]
From the results shown in Table 1, it can be seen that each of the substrates No. 1 to No. 6 for a printed wiring board has high adhesion strength between the conductive layer and the base film, which is indicated by the peel strength of 4.5 N/cm or more, and has circuit formability for forming a fine conductive pattern having L/S=20 μm/20 μm. In contrast, the substrate No. 7 for a printed wiring board, although having high adhesion strength between the conductive layer and the base film, does not have circuit formability for forming a fine conductive pattern. Thus, it can be seen that the circuit formability can be improved by making the maximum height Sz of the surface of the base film less than 0.9 Presumably, this is because the conductive layer can be uniformly removed easily when the maximum height Sz is less than 0.9 μm.

From the results shown in Table 1, it can be seen that the maximum height Sz can be increased and the peel strength can be improved by performing wet-blasting treatment to roughen the surface of the base film before forming the conductive layer on the base film. That is, it can be seen that adhesion strength between the conductive layer and the base film can be improved by increasing the maximum height Sz.

From the results shown in Table 1, it can be seen that adhesion strength between the conductive layer and the base film can be considerably improved and the circuit formability can be increased by performing alkali treatment on the base film before forming the conductive layer on the base film. Presumably, the adhesion strength between the conductive layer and the base film is considerably improved because of the combined effect of an increase of the maximum height Sz resulting from alkali treatment and a decrease of contact angle resulting from hydrophilization. Presumably, the circuit formability is improved because the microscopic smoothness of the surface of the base film is improved by performing alkali treatment.

By comparing No. 1 to No. 3 with No. 4 to No. 6, it can be seen that the skewness Ssk increases considerably by performing wet-blasting treatment. Thus, presumably, the peel strength is improved because the degree of asymmetry of roughness shapes is increased by performing wet-blasting treatment and a so-called "anchor effect" is increased.

The root mean square height Sq of No. 7 is considerably greater than those of No. 1 to No. 6. This shows that variation in the height of roughness shapes on the surface of the base film of No. 7 is greater than those of No. 1 to No. 6. When the variation is large, a short circuit between conductive patterns or unintended peeling becomes more likely to occur when removing the conductive layer by etching. Presumably, for this reason, it was not possible for No. 7, having a large root mean square height Sq, to have circuit formability for forming a fine circuit pattern.

When No. 1 to No. 3 are compared with each other, it can be seen that the circuit formability improves as the contact angle decreases. Presumably, this is because, when the maximum height Sz is less than 0.9 µm, the conductive layer can be uniformly removed easily, and, in addition, as the contact angle decreases, the conductive layer can be more easily removed from the base film by etching.

The circuit formability is also related to adhesion strength between the polyimide film and the conductive layer. When the adhesion strength is low, the conductive pattern tends to be peeled off easily, and the circuit formability tends to decrease. Accordingly, the circuit formability of No. 3 is better than that of No. 1, presumably because No. 3 has a higher adhesion strength than No. 1 due to other factors, although the maximum height Sz of No. 3 is comparatively large.

INDUSTRIAL APPLICABILITY

A substrate for a printed wiring board and a resin base material according to the present invention, which has good circuit formability while maintaining adhesion strength between the conductive layer and the base film, is preferably used for a printed wiring board or the like for which high-density printed wiring is required.

The invention claimed is:

1. A substrate for a printed wiring board, comprising:
a base film having an insulating property; and
a conductive layer formed on at least one surface of the base film,
wherein a maximum height Sz, which is defined in ISO25178, of the surface of the base film is 0.05 µm or more and less than 0.9 µm, and the conductive layer is formed by application and heating of a conductive ink including metal particles.

2. The substrate for a printed wiring board according to claim 1, wherein an arithmetical mean height Sa, which is defined in ISO25178, of the exposed surface of the base film is 0.01 µm or more and less than 0.2 µm.

3. The substrate for a printed wiring board according to claim 1, wherein a contact angle between the exposed surface of the base film and pure water is 4° or more and 60° or less.

4. The substrate for a printed wiring board according to claim 1, wherein a main component of the base film is polyimide.

5. The substrate for a printed wiring board according to claim 1, wherein a mass fraction of chrome in a region near an interface between the base film and the conductive layer is 100 ppm or less.

6. The substrate for a printed wiring board according to claim 1, wherein the surface of the base film is alkali treated or plasma treated.

7. The substrate for a printed wiring board according to claim 1, wherein the metal is copper or a copper alloy.

8. A printed wiring board comprising a conductive pattern,
wherein the conductive pattern is formed in the conductive layer of the substrate for a printed wiring board according to claim 1 by using a subtractive method or a semi-additive method.

9. A method for producing a substrate for a printed wiring board, comprising: a step of adjusting a maximum height Sz, which is defined in ISO25178, of a surface of a base film (maximum height Sz adjusting step); a step of forming a conductive layer on one surface of the base film having an insulating property (conductive layer forming step); and a step of performing electroless plating to fill a surface of the conductive layer, the surface being opposite to the base film, with a metal derived from electroless plating (electroless plating step), wherein the step of forming a conductive layer on one surface of a base film having an insulating property includes a step of forming the conductive layer by application and heating of a conductive ink including metal particles.

10. The method for producing a substrate for a printed wiring board according to claim 9, wherein the step of adjusting a maximum height Sz, which is defined in ISO25178, of a surface of a base film includes a step of alkali treating or plasma treating the surface of the base film.

11. The method for producing a substrate for a printed wiring board according to claim 9, wherein the metal is copper or a copper alloy.

12. A method for producing a printed wiring board, comprising: a step of forming a conductive layer on one surface of a resin base material having an insulating property (conductive layer forming step); and a step of forming a conductive pattern (conductive pattern forming step), wherein the step of forming a conductive layer on one surface of a resin base material having an insulating property includes a step of forming the conductive layer by application and heating of a conductive ink including metal particles.

13. The method for producing a printed wiring board according to claim 12, wherein the metal is copper or a copper alloy.

14. The method for producing a printed wiring board according to claim 12, wherein the step of forming a conductive pattern includes a step of forming the conductive pattern in the conductive layer of the printed wiring board by using a subtractive method or a semi-additive method.

15. A method for producing a printed wiring board, comprising:
a step of forming a conductive layer on at least one surface of a resin base material, wherein a maximum height Sz, which is defined in ISO25178, of a surface thereof is 0.05 µm or more and less than 0.9 µm; and
a step of forming a conductive pattern in the conductive layer by using a subtractive method or a semi-additive method, wherein the step of forming a conductive layer on at least one surface of a resin base material includes a step of forming the conductive layer by application and heating of a conductive ink including metal particles.

16. The method for producing a printed wiring board of claim 15, wherein the metal is copper or a copper alloy.

* * * * *